United States Patent
Heupke et al.

(10) Patent No.: US 10,097,015 B2
(45) Date of Patent: Oct. 9, 2018

(54) ELECTRICAL COMBINATION

(71) Applicant: CHERVON (HK) LIMITED, Wanchai (HK)

(72) Inventors: Wilhelm Heupke, Nanjing (CN); Zheng Geng, Nanjing (CN); Yuexiang Zhang, Nanjing (CN)

(73) Assignee: Chervon (HK) Limited, Wanchai (HK)

( * ) Notice: Subject to any disclaimer, the term of this patent is extended or adjusted under 35 U.S.C. 154(b) by 0 days.

(21) Appl. No.: 15/190,804

(22) Filed: Jun. 23, 2016

(65) Prior Publication Data
US 2017/0025870 A1    Jan. 26, 2017

(30) Foreign Application Priority Data

Jun. 24, 2015  (CN) .......................... 2015 1 0353781

(51) Int. Cl.
  *B25F 5/00* (2006.01)
  *H02J 7/00* (2006.01)
  *G01R 31/02* (2006.01)
  *H01M 2/20* (2006.01)

(52) U.S. Cl.
  CPC .............. *H02J 7/0026* (2013.01); *B25F 5/00* (2013.01); *G01R 31/02* (2013.01); *H01M 2/20* (2013.01); *H02J 7/007* (2013.01); *H02J 7/0045* (2013.01); *H01M 2200/00* (2013.01)

(58) Field of Classification Search
  CPC ....... B25F 5/00; H01M 2200/00; H01M 2/20; H02J 7/0045; H02J 7/007
  See application file for complete search history.

(56) References Cited

U.S. PATENT DOCUMENTS

| | | | | |
|---|---|---|---|---|
| 5,896,025 | A * | 4/1999 | Yamaguchi ........... | H02J 7/0031 320/134 |
| 6,066,939 | A * | 5/2000 | Nagai ................... | H02J 7/0036 320/127 |
| 7,486,049 | B2 * | 2/2009 | Wan ...................... | H02J 7/0031 320/134 |
| 2010/0308834 | A1 * | 12/2010 | Kawai ................. | B60L 11/1861 324/433 |
| 2014/0225544 | A1 * | 8/2014 | Mergener ............... | B25D 17/00 318/400.22 |
| 2014/0239966 | A1 * | 8/2014 | Song ................... | G01R 31/3658 324/434 |
| 2014/0262390 | A1 * | 9/2014 | Arimura ................. | B25B 21/02 173/7 |

* cited by examiner

*Primary Examiner* — Muhammad S Islam
(74) *Attorney, Agent, or Firm* — Greenberg Traurig, LLP (57) ABSTRACT

An electrical combination includes a power tool and battery pack. The battery pack includes a detection terminal and a normal terminal, two detection circuits, and a control module for respectively connecting with the two terminals. The control module can detect and compare voltage signals in the detection circuits. One detection circuit is used to provide a comparing reference and the other detection circuit is used as a circuit of the terminals and to apply the same voltage on the terminals. A difference between voltages sampled from voltage sampling points and a predetermined value is compared to determine whether the resistance of the terminals is increased. The method can help to decide whether the connection of terminals is good or not.

3 Claims, 5 Drawing Sheets

ELECTRICAL COMBINATION

RELATED APPLICATION INFORMATION

This application claims the benefit under 35 U.S.C. § 119(a) of Chinese Patent Application No. CN 201510353781.7, filed on Jun. 24, 2015, the disclosure of which is incorporated herein by reference in its entirety.

FIELD OF THE DISCLOSURE

The present disclosure relates generally to an electrical combination of an electrical device and a battery pack and, more particularly, to an electrical combination of a power tool and a battery pack.

BACKGROUND OF THE DISCLOSURE

Battery packs and electrical devices, such as power tools, are usually connected by metal terminals which are able to connect physically.

When the connection between the two metal terminals is bad, that is equivalent to a resistor with large resistance being arranged in the circuit. If a large current flows through the circuit of the two metal terminals, lots of heat is generated, so that the terminals may deform due to the heat and the connection may worsen.

The statements in this section merely provide background information related to the present disclosure and may not constitute prior art.

SUMMARY

In one aspect of the disclosure, an electrical combination comprises a power tool and a battery pack.

The power tool includes a motor, a power tool positive terminal allowing the current to flow into the motor, a power tool negative terminal allowing the current to flow out of the motor, a power tool positive detection terminal which is electrically connected with the power tool positive terminal, and a power tool negative detection terminal which is electrically connected with the power tool negative terminal.

The battery pack includes a battery pack positive terminal for connecting with the power tool positive terminal, a battery pack negative terminal for connecting with the power tool negative terminal, a battery pack positive detection terminal for connecting with the power tool positive detection terminal, a battery pack negative detection terminal for connecting with the power tool negative detection terminal, a battery including a positive electrode which is connected to the battery pack positive terminal and a negative electrode which is connected to the battery pack negative terminal, a first positive detection circuit for connecting the battery pack positive terminal to the negative electrode of the battery, a second positive detection circuit for connecting the battery pack positive detection terminal to the negative electrode of the battery, a first negative detection circuit for connecting the battery pack negative terminal to the positive electrode, a second negative detection circuit for connecting the battery pack negative detection terminal to the positive electrode, and a controller. The controller is operable to detect a first positive voltage detection signal from the first positive detection circuit, detect a second positive voltage detection signal from the second positive detection circuit, detect a first negative voltage detection signal from the first negative detection circuit, detect a second negative voltage detection signal from the second negative detection circuit, output a control signal to cut off the connection between the battery and battery pack positive terminal or/and the connection between the battery and battery pack negative terminal when the difference between the first positive voltage detection signal and the second positive voltage detection signal or the difference between the first negative voltage detection signal and the second negative voltage detection signal is greater than a predetermined value.

In another aspect of the disclosure, another electrical combination is also provided. The electrical combination comprises a power tool, a battery pack and a controller.

The power tool includes a motor, a power tool terminal connected to the motor, and a power tool detection terminal connected to the power tool terminal.

The battery pack includes a battery pack terminal for connecting with the power tool terminal; a battery pack detection terminal for connecting with the power tool detection terminal; a battery which is electrically connected with a first potential point and a second potential point which has different potential from the first potential point, the battery pack detection terminal connected to the first potential point; a first detection circuit for connecting the battery pack terminal to the second potential point; and a second detection circuit for connecting the battery pack detection terminal to the second potential point.

The controller is operable to detect a first voltage detection signal from the first detection circuit, detect a second voltage detection signal from the second detection circuit, output a control signal to cut off the connection between the battery and battery pack terminal when the difference between the first voltage detection signal and the second voltage detection signal is greater than a predetermined value.

Specifically, the controller is preferably disposed in the battery pack.

Further areas of applicability will become apparent from the description provided herein. It should be understood that the description and specific examples are intended for purposes of illustration only and are not intended to limit the scope of the present disclosure.

The drawings described herein are for illustrative purposes only of selected embodiments and not all possible implementations, and are not intended to limit the scope of the present disclosure. Corresponding reference numerals indicate corresponding parts throughout the several views of the drawings.

DETAILED DESCRIPTION

The following description of the preferred embodiments is merely exemplary in nature and is in no way intended to limit the scope of the invention hereinafter claimed, its application, or uses.

Figure 1:
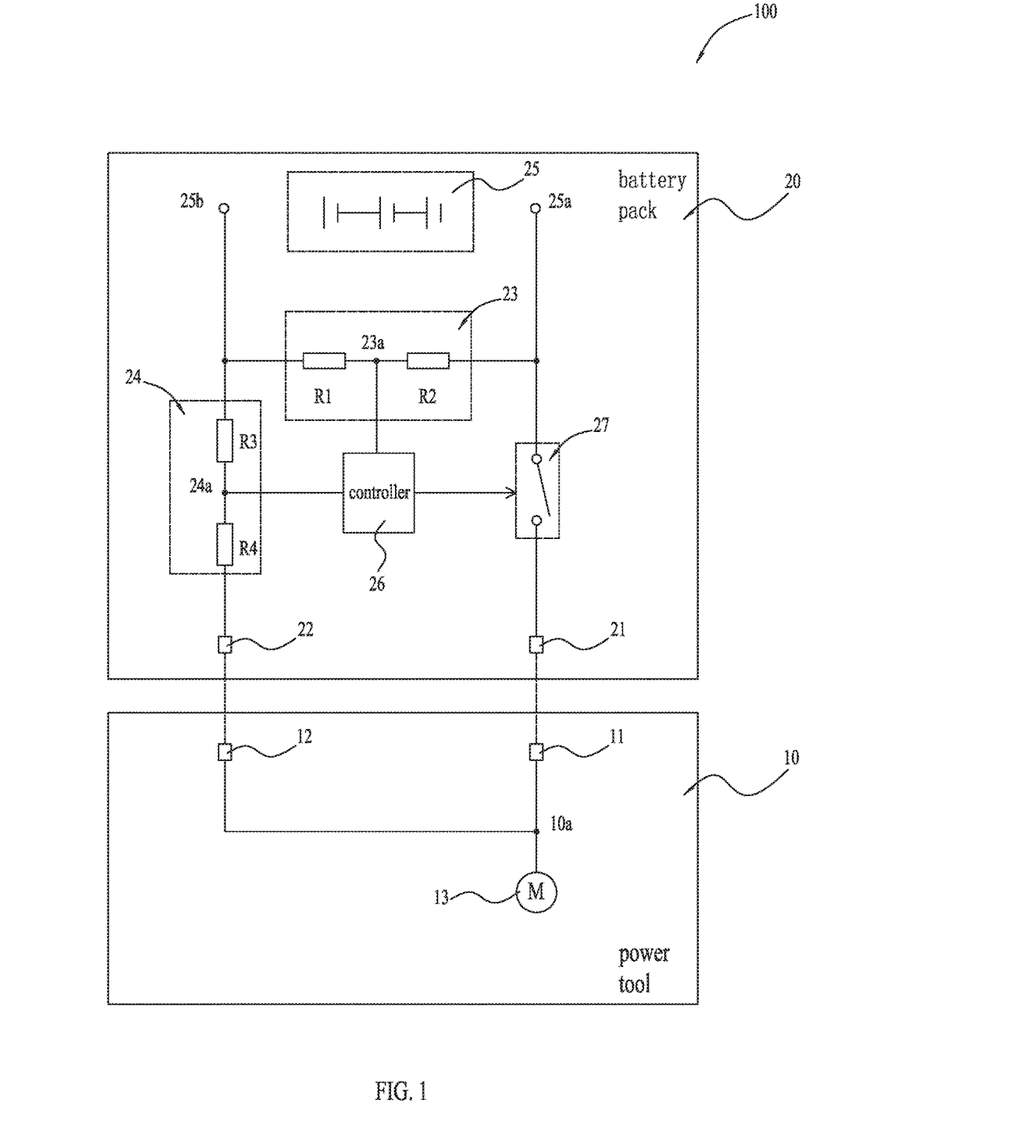
FIG. 1 is a schematic view of an exemplary electrical combination of an electrical device and a battery pack.

As shown in FIG. 1, an electrical combination 100 comprises a power tool 10 and a battery pack 20.

The battery pack 20 is configured to connect with a power tool 10 and supply power to the power tool 10.

The power tool 10 includes a first power tool terminal 11 and a second power tool terminal 12. The first power tool terminal 11 and the second power tool terminal 12 are connected to a same potential point 10a in power tool 10 so as to have equal potential.

The power tool 10 further includes a motor 13 which is connected to the same potential point 10a.

The battery pack 20 may comprises a first battery pack terminal 21 and a second battery pack terminal 22 which are configured to connect with the first power tool terminal 11 and the second power tool terminal 12 of the power tool 10 respectively.

The battery pack 20 may further comprises a first detection circuit 23, a second detection circuit 24 and a battery 25.

The first detection circuit 23 and the second detection circuit 24 are configured to generate voltage signals. The battery 25 is electrically connected with a first potential point 25a and a second potential point 25b. The electrical energy of the battery 25 causes a potential difference between the first potential point 25a and the second potential point 25b, and the first potential point 25a has a higher potential than the second potential point 25b.

The first detection circuit 23 is electrically connected between the first potential point 25a and the second potential point 25b. The second detection circuit 24 is electrically connected between the second potential point 25b and the second battery pack terminal 22. The first battery pack terminal 21 is connected with the first potential point 25a.

When the first battery pack terminal 21 and the second battery pack terminal 22 are respectively physically connected with the first power tool terminal 11 and the second power tool terminal 12 of the power tool 10, the first battery pack terminal 21, the first power tool terminal 11, the second power tool terminal 12, the second battery pack terminal 22 and the second detection circuit 24 are connected to constitute a current path. If a voltage of the first potential point 25a is higher than that of second potential point 25b, the current flows through the first battery pack terminal 21, the first power tool terminal 11, the second power tool terminal 12, the second battery pack terminal 22 and the second detection circuit 24 in turn. If the voltage of the first potential point 25a is lower than that of second potential point 25b, the current flows through the elements in the reverse order.

When the first battery pack terminal 21 and the first power tool terminal 11 contact each other well, the equivalent resistance of the physical connection between the first battery pack terminal 21 and the first power tool terminal 11 is relatively small and can be ignored.

When first battery pack terminal 21 and the first power tool terminal 11 contact each other badly, the equivalent resistance of the physical connection between the first battery pack terminal 21 and the first power tool terminal 11 is relatively large which may generate a large pressure drop.

When the second battery pack terminal 22 and the second power tool terminal 12 contact each other well, the equivalent resistance of the physical connection between the second battery pack terminal 22 and the second power tool terminal 12 is relatively small and can be ignored.

When the second battery pack terminal 22 and the second power tool terminal 12 contact each other badly, the equivalent resistance of the physical connection between the second battery pack terminal 22 and the second power tool terminal 12 is relatively large which may generate a large pressure drop.

The first detection circuit 23, which is arranged between the first potential point 25a and the second potential point 25b, is constituted by fixed electronic elements. The current flowing through the first detection circuit 23 is relatively constant when the voltage between the first potential point 25a and the second potential point 25b is constant. So, a first voltage detecting point 23a in the first detection circuit 23 is capable of being detected for a first voltage signal as a comparing reference.

Preferably, the first detection circuit 23 includes two resistors R1, R2 which are connected in series. The first voltage detecting point 23a is disposed between the two resistors R1, R2, so that the voltage of the first voltage signal can be controlled by adjusting the resistances of the two resistors R1, R2.

When the first battery pack terminal 21 and second battery pack terminal 22 are respectively physically connected with the first power tool terminal 11 and second power tool terminal 12 of the power tool, in the current path between the first potential point 25a and the second potential point 25b, which is constituted by the second detection circuit 24, if the first battery pack terminal 21 is physically connected well with the first power tool terminal 11, the equivalent resistance is very small, that is equivalent to connect the first potential point 25a with the power tool through them so that the potentials of the potential point 10a and the first potential point 25a are approximately equivalent. In this condition, the connection between the first battery pack terminal 21 and the first power tool terminal 11 can be used to carry large current and transmit signals. If the first battery pack terminal 21 is not physically connected well with the first power tool terminal 11, the equivalent resistance is large which may generate the large pressure drop and reduce the potential of the potential point 10a, and the utilization of the electric energy is reduced. Further, because the equivalent resistance in the bad-connection condition is increased relative to that in the well-connected condition, the current in the current path is reduced. So a second voltage detecting point 24a for detecting a second voltage signal is arranged in the second detection circuit 24. The second voltage signal can reflect the current changes in the current path so as to detect the connection between the first battery pack terminal 21 and the first power tool terminal 11.

The second detection circuit 24 is constituted by fixed electronic elements, so the second voltage signal is affected by the equivalent resistance at the connection between the second battery pack terminal 22 and the second power tool terminal 12. The electrical connection between the battery pack and the power tool is mainly realized by the connection between the first battery pack terminal 21 and the first power tool terminal 11. The arrangement of the second battery pack terminal 22 and the second power tool terminal 12 is mainly used to detect the first battery pack terminal 21 and the first power tool terminal 11. The resistance of the second detection circuit 24 can be arranged so that the current flowing through the connection between the second battery pack terminal 22 and the second power tool terminal 12 is small.

Thus, the second battery pack terminal 22 and the second power tool terminal 12 are not easy to have a bad connection due to a large current.

Assuming that a potential difference between the first potential point 25a and the second potential point 25b is fixed, and the voltage of the first potential point 25a is higher.

When the first battery pack terminal 21 is well connected with the first power tool terminal 11, that is the equivalent resistance is small, the first potential point 25a and the potential point 10a are equivalent to be a same points, the first battery pack terminal 21 and the first power tool terminal 11 can be used to output or input current. In this condition, if the second battery pack terminal 22 is well connected with the second power tool terminal 12, that is the equivalent resistance of the physical connection between the second battery pack terminal 22 and the second power tool terminal 12 is small, it is equivalent to there being only the second detection circuit 24 arranged between the first potential point 25a and the second potential point 25b. If the second detection circuit 24 can limit the current effectively, the current flowing through the connection between the second battery pack terminal 22 and the second power tool terminal 12 is small, in this condition, the sampled second voltage signal can be used as a threshold value. When the second voltage signal is smaller than or equal to the threshold value, it is considered that the connection between the battery pack and the power tool is good. Otherwise, if the second battery pack terminal 22 is not well connected with the second power tool terminal 12, the equivalent resistance of the physical connection between the second battery pack terminal 22 and the second power tool terminal 12 is large, the current flowing through the connection between the second battery pack terminal 22 and the second power tool terminal 12 is smaller, in this condition, the value of the sampled second voltage signal certainly exceeds the threshold value. Although the first battery pack terminal 21 is well connected with the first power tool terminal 11 in this condition, the second battery pack terminal 22 and the second power tool terminal 12 interfere with the accuracy of detection, so it is considered that the connection between the battery pack and the power tool is unreliable. Under the two conditions described above, use of the battery pack should be stopped automatically or a user should be prompted to stop using the battery pack.

When the first battery pack terminal 21 is not physically connected well with the first power tool terminal 11, that is the equivalent resistance physical connection between the first battery pack terminal 21 and the first power tool terminal 11 is large, regardless of whether the second battery pack terminal 22 is well connected with the second power tool terminal 12, the value of the second voltage signal exceeds the threshold value.

In conclusion, when the first battery pack terminal 21 and the second battery pack terminal 22 are respectively physically connected with the first power tool terminal 11 and second power tool terminal 12, regardless of which group has the bad connection, the comparison between the value of the second voltage signal and the threshold value can decide the condition that the batter pack should not be used continuously. That is when the second voltage signal exceeds the threshold value, it is considered that the condition that the batter pack should not be used continuously appears.

In practice, the potential difference between the first potential point 25a and the second potential point 25b originates from the voltage of cells of the battery pack. The voltage of cells of the battery pack changes with the capacity of the battery pack, so even though the first battery pack terminal 21 and the second battery pack terminal 22 and the first power tool terminal 11 and second power tool terminal 12 of the power tool are maintained good physical connection, the second voltage signal also changes with the voltage of the cells. That is the second voltage signal cannot compare with a fixed threshold.

In order to solve the problem, the first detection circuit 23 is arranged so that the first voltage signal detected in the first detection circuit 23 changes with the voltage of the battery 25. Thus, the first and second voltage signals are compared dynamically. If the difference between the first and second voltage signals exceeds the threshold value, it is considered that the condition that the battery pack 20 is inappropriate to use continuously appears.

Further, a switch device is provided to control the first detection circuit 23. Only when it is needed to detect, the switch is triggered so as to connect the first detection circuit 23 between the first potential point 25a and the second potential point 25b, which can avoid consumption of the batter pack. Also, the resistors R1, R2 can be selected with large resistances so that the current in the first detection circuit 23 is small.

Preferably, the second detection circuit 24 includes two resistors R3, R4 which are connected in series. The second detecting point d for detecting the second voltage signal is disposed between the two resistors R3, R4.

Preferably, the first power tool terminal 11 and the second power tool terminal 12 of the power tool can be integrated as a metal part. Or it is not needed to arrange two metal parts in the power tool to respectively correspond with the first and second battery pack terminals B1, B2. It is only needed to connect the first and second battery pack terminals 21,22 with the same metal part. But the first and second battery pack terminals 21, 22 must use different metal parts.

Figure 5:
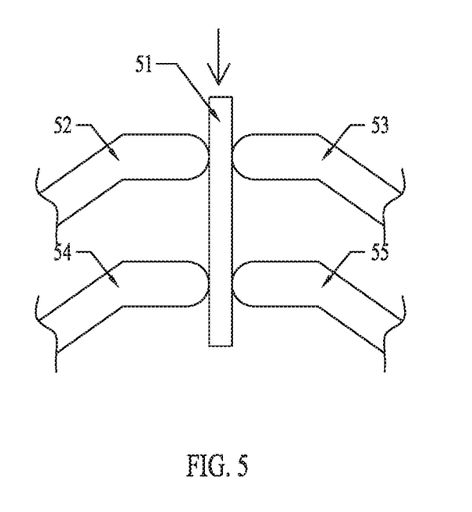
FIG. 5 is a schematic view of an exemplary battery pack terminal and an exemplary electrical device terminal.

With reference to FIG. 5, preferably, the first power tool terminal 11 and the second power tool terminal 12 of the power tool can be integrated as a metal connection plate 51. The first battery pack terminal 21 is made into two metal claws 52, 53, the second battery pack terminal 22 is made into two metal claws 54, 55. The claws 52, 53 are respectively disposed on the two sides of the connection plate 51 and at the position of insertion and extraction. The claws 54, 55 have the similar arrangement. When the connection plate 51 is inserted along the direction of arrow, it can be engaged with the claws 52, 53, 54, 55.

The embodiment described above has advantages. The power tool can be engaged with the currently known battery packs through changing the terminal structure. Further, the numbers and size of the terminals are reduced.

Figure 6:
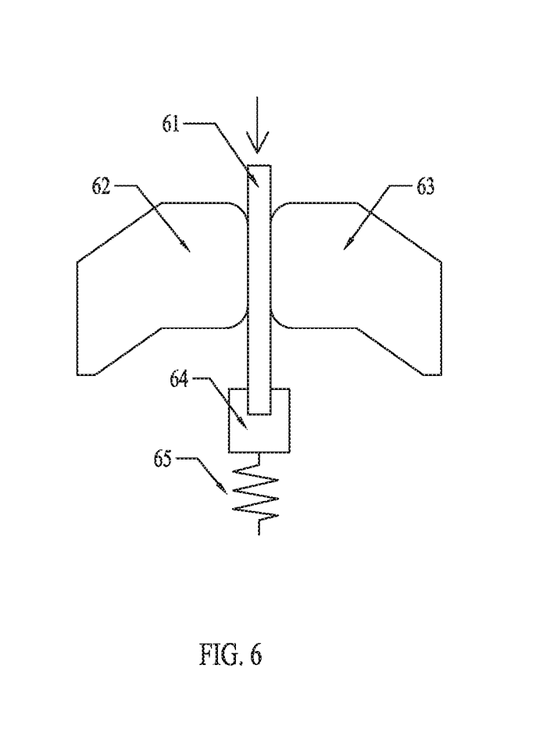
FIG. 6 is a schematic view of another exemplary battery pack terminal and another exemplary electrical device terminal.

With reference to FIG. 6, in another embodiment, the first power tool terminal 11 and the second power tool terminal 12 of the power tool can be integrated as a metal connection plate 61. The first battery pack terminal 21 is made into two metal fixture blocks 62, 63. In order to ensure good physical connection, the fixture blocks 62, 63 can be designed to have a big size, especially the size of a part that is contacted with the connection plate 61. The second battery pack terminal 22 can be made into a metal component 64 which is disposed in the insertion direction of the connection plate 61. The metal component 64 is contacted with an end of the connection plate 61 after the insertion of the connection plate 61 is finished. For obtaining better connection, the metal component 64 can include a recess, and an elastic element 65 can be arranged so as to bias the metal component 64 against the connection plate 61.

A controller 26 and a switch 27 are provided. The controller 26 can consist of an integrated circuit and a peripheral circuit, which is capable of receiving the first and second voltage signals, comparing and deciding whether their difference exceeds a predetermined value, and outputting a corresponding control signal to protect the battery pack or remind the user. Alternatively, the controller 26 can be arranged in the power tool 10. The first and second voltage signals can be transmitted to the controller 26 in the power tool through corresponding connection terminals in a method of wired communication, or in a method of wireless communication by arranging wireless communication modules in the battery pack 20 and the power tool 10.

The power tool 10 is an electrical equipment that consumes electric energy and converts to other energy. The battery pack 20 provides electric energy to the power tool 10. Alternatively, a charger for charging the battery pack 20 may also have two connecting terminals as the first power tool terminal and the second power tool terminal in the power tool. The solution for detecting whether the battery pack 20 and the power tool 10 are connected well also applies to detecting whether the battery pack 20 and the charger which has two connected connecting terminals.

In order to realize active protection, when the difference between the first and second voltage signals is greater than the predetermined value, the controller 26 outputs the control signal. The control signal is used to control the switch 27 to cut off the connection between the first battery pack terminal 21 and the battery 25, so there is no current flowing through the first battery pack terminal 21, and the protection is realized.

In another situation that detect whether the battery pack 20 and the charger which has two connected connecting terminals, the charger cut off the power supply to the connecting terminals, so the charger cannot charge the battery pack, and the protection is realized. Whatever the power tool or the charger, the controller can output an alarm signal to remind the user to disconnect them. The alarm signal can be produced by a warning light, a buzzer or both of them.

Figure 2:
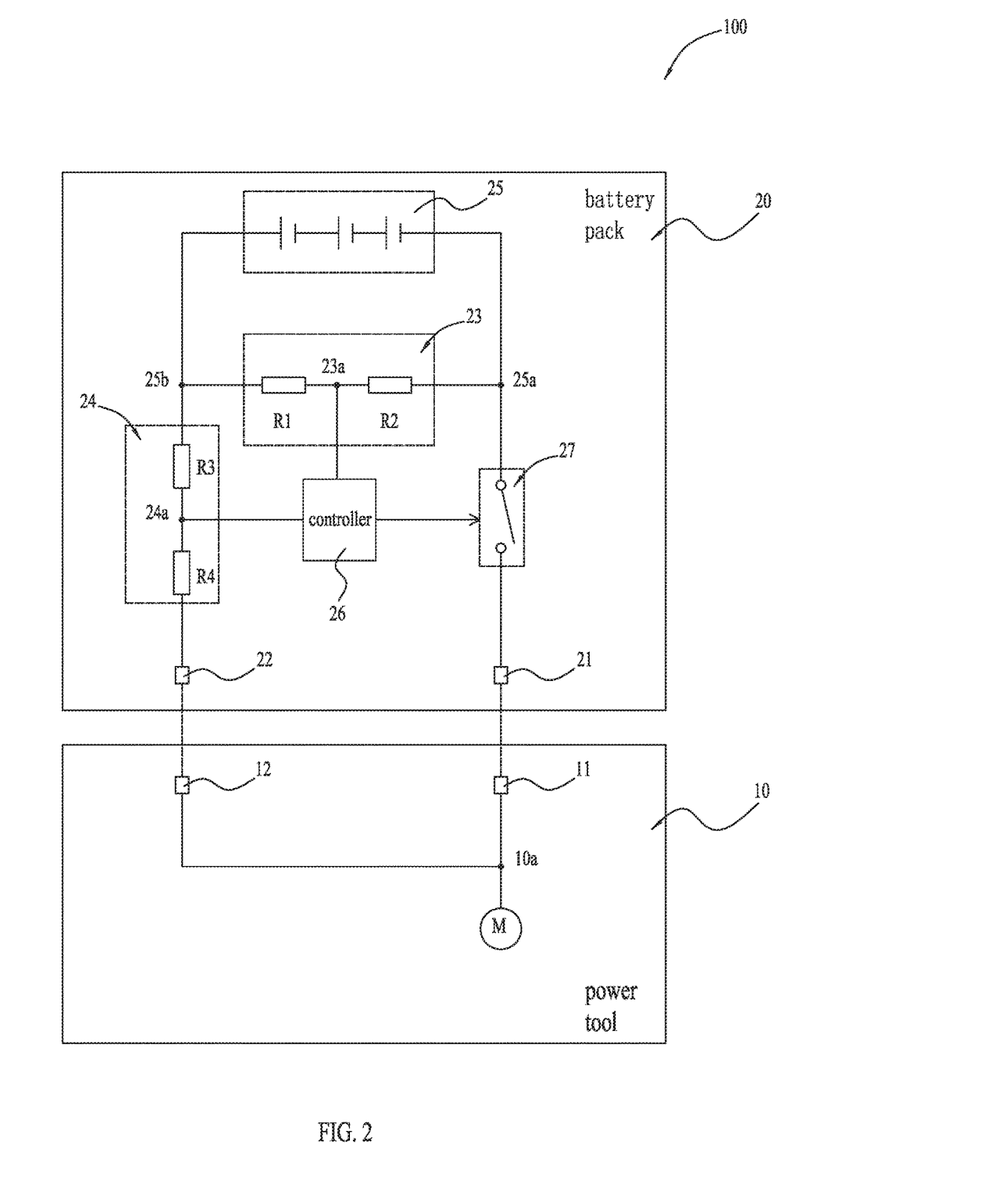
FIG. 2 is a schematic view of an exemplary circuit, wherein a first battery pack terminal acts as a negative output of the battery pack in FIG. 1.

With reference to FIG. 2, when the first battery pack terminal 21 acts as a negative output of the battery pack and the second battery pack terminal 22 acts as a detection terminal, the first potential point 25a and the second potential point 25b are connected with the positive electrode and the negative electrode of the battery 25 as shown in FIG. 2. As described above, the voltage between the first voltage detecting point 23a and the second voltage detecting point 24a can indicate the connection status between the first battery pack terminal 21 and the first power tool terminal 11. Or the first potential point 25a and the second potential point 25b can be connected with the peripheral circuit and generate voltage therebetween.

Figure 3:
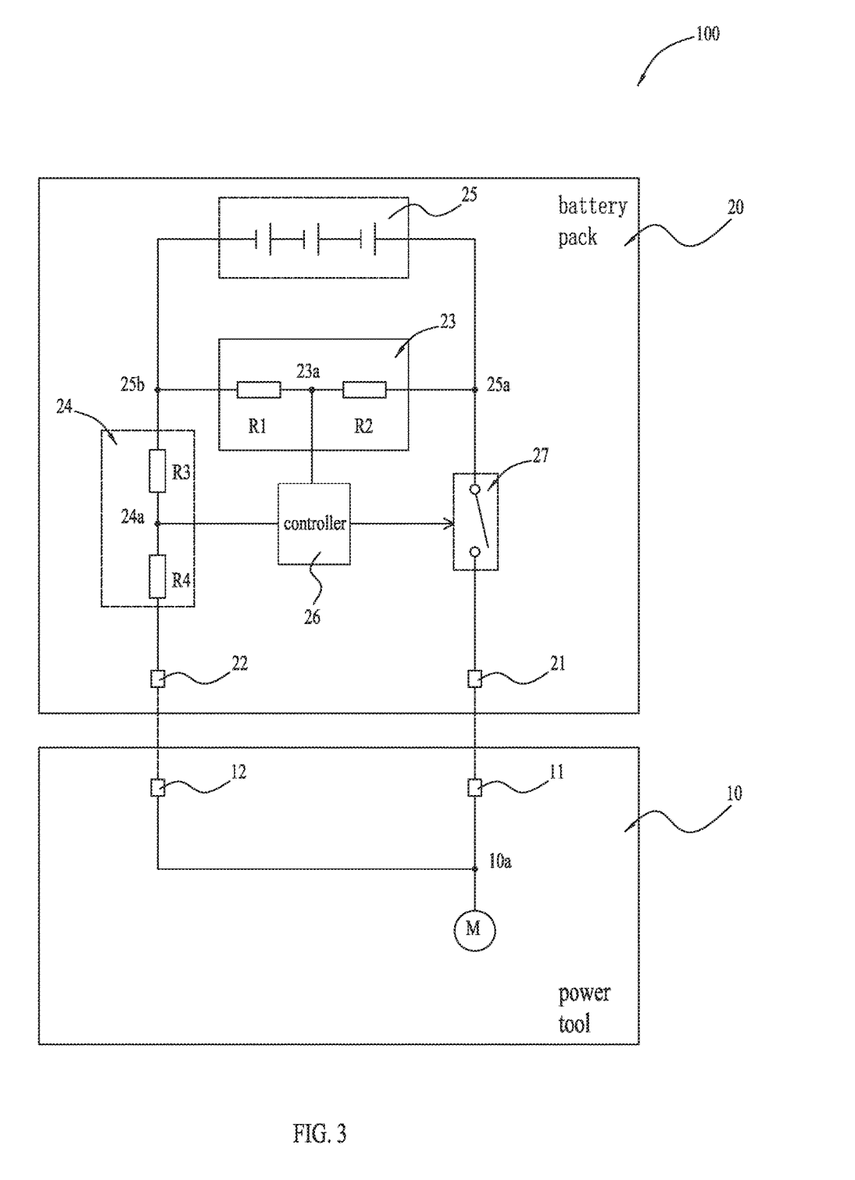
FIG. 3 is a schematic view of an exemplary circuit, wherein a negative battery pack terminal acts as a positive output of the battery pack in FIG. 1.

With reference to FIG. 3, if the positive electrode and the negative electrode of the battery 25 is connected in the opposite manner, the first battery pack terminal 21 acts as a positive output of the battery pack 20, and the second battery pack terminal 22 acts as the detection terminal. In this embodiment, the controller 26 can also indicate the connection status between the first battery pack terminal 21 and the first power tool terminal 11.

Further, based on the hardware in FIG. 1, a method is provided to detect the connection status between the power tool 10 and the battery pack 20, the method includes:

connecting the first battery pack terminal 21 with the first power tool first power tool terminal 11;

connecting the second battery pack terminal 22 with the second power tool second power tool terminal 12;

making the current flow through the first battery pack terminal 21 and the first power tool first power tool terminal 11;

making the current flow through the second battery pack terminal 22 and the second power tool second power tool terminal 12;

setting the first battery pack terminal 21, the first power tool first power tool terminal 11, the second power tool second power tool terminal 12 and the second battery pack terminal 22 in turn in a first current path;

setting a second current path which has the same high voltage side and low voltage side as the first current path;

detecting the first voltage signal from the first current path;

detecting the second voltage signal from the second current path; and comparing the first voltage signal and the second voltage signal, and outputting the control signal when the difference of them exceeds the predetermined value.

After the control signal is output, a corresponding protection measure can be taken, for example, making the first battery pack terminal have no charge when it is charged, or cutting off the connection between the first battery pack terminal and the battery.

The first power tool terminal 11 and the second power tool terminal 12 may be structured to have the same physical structure.

Figure 4:
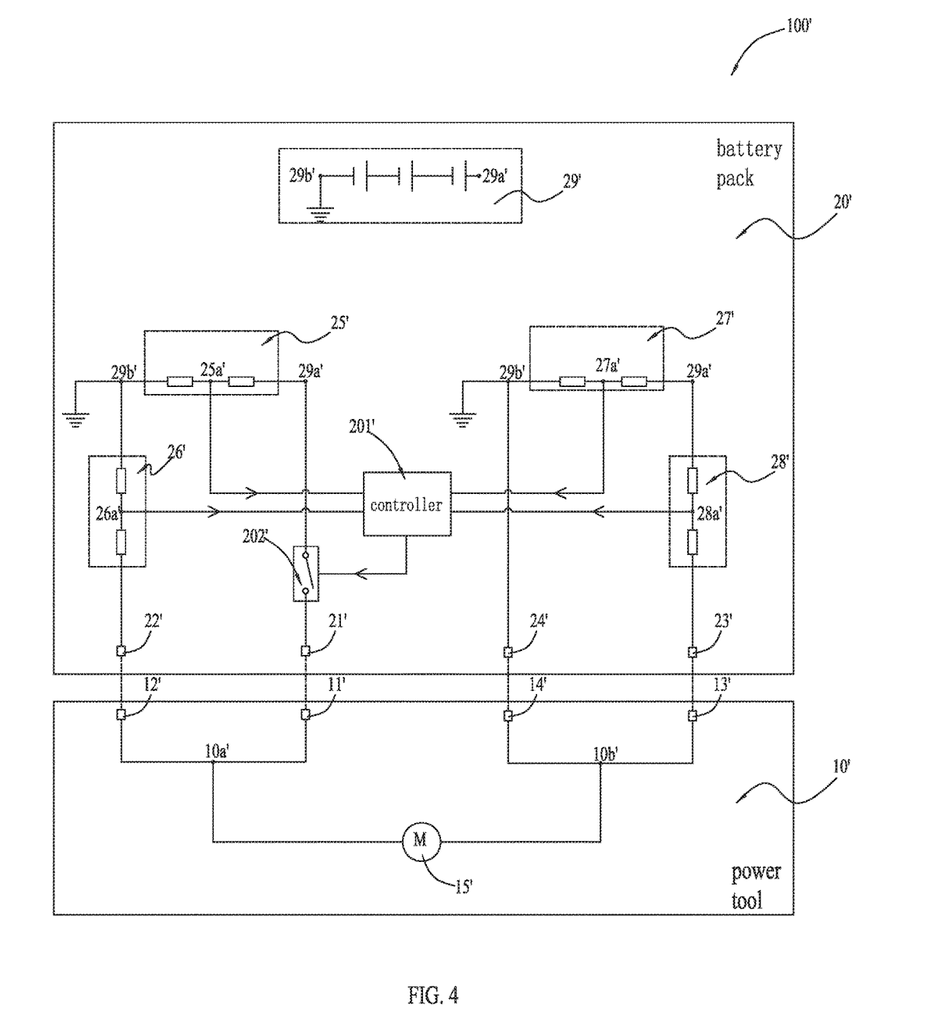
FIG. 4 is a schematic view of an exemplary electrical combination of a power tool and a battery pack.

With reference to FIG. 4, another electrical combination 100' is provided.

The electrical combination 100' may include a power tool 10' and battery pack 20'.

The power tool 10' may includes a power tool positive terminal 11', a power tool positive detection terminal 12', a power tool negative terminal 13', a power tool negative detection terminal 14' and a motor 15'.

The power tool positive terminal 11' allows the current to flow into the power tool. The power tool negative terminal 13' allows the current to flow out of the power tool. The power tool positive detection terminal 12' is electrically connected with the power tool positive terminal 11'. The power tool negative detection terminal 14' is electrically connected with the power tool negative terminal 13'.

The motor 15' can access the current from the power tool positive terminal 11' and the power tool negative terminal 13', so that it can convert the electric energy into other energy to realize the function of the power tool. The power tool positive terminal 11' and the power tool negative terminal 13' are respectively connected with the two ends of the motor 15'. Otherwise, if the motor 15' includes a motor with a driving circuit, the power tool positive terminal 11' and the power tool negative terminal 13' can be respectively connected with the two ends of the driving circuit.

The battery pack 20' includes a battery pack positive terminal 21', a battery pack positive detection terminal 22', a battery pack negative terminal 23', a battery pack negative detection terminal 24', a first positive detection circuit 25', a second positive detection circuit 26', a first negative detection circuit 27', a second negative detection circuit 28' and a battery 29'.

The battery 29' is used to store and output electric energy. The positive electrode of the battery 29' is connected with a first potential point 29a', and the negative electrode of the battery is connected with a second potential point 29b'.

The first positive detection circuit 25' is used to generate a first positive voltage detection signal, and the second positive detection circuit 26' is used to generate a second positive voltage detection signal. The first negative detection circuit 27' is used to generate a first negative voltage detection signal, and the second negative detection circuit 28' is used to generate a second negative voltage detection signal. They output the voltage signals from the detecting points 25a', 26a', 27a' and 28a' respectively.

The battery pack positive detection terminal 22' and the battery pack negative detection terminal 24' are respectively connected with the power tool positive detection terminal 12' and the power tool negative detection terminal 14' when the battery pack 20' is connected with the power tool 10'.

The battery pack positive terminal 21' is electrically connected with the first potential point 29a', and the battery pack negative terminal 24' is electrically connected with the second potential point 29b'. That is equivalent to the battery pack positive terminal 21' and the battery pack negative terminal 24' being respectively connected with the positive electrode and the negative electrode of the battery pack.

The first positive detection circuit 25' is electrically connected with the battery pack positive terminal 21', and the second positive detection circuit 26' is electrically connected with the battery pack positive detection terminal 22'. The first negative detection circuit 27' is electrically connected with the battery pack negative terminal 24', and the second negative detection circuit 28' is electrically connected with the battery pack negative detection terminal 24'.

With reference to FIG. 4, when the power tool positive terminal 11' is connected with the battery pack positive terminal 21' and the power tool positive detection terminal 12' is connected with the battery pack positive detection terminal 22', the first positive detection circuit 25' and second positive detection circuit 26' are respectively connected with the first potential point 29a' and the second potential point 29b'. When the power tool negative terminal 13' is connected with the battery pack negative terminal 24' and the power tool negative detection terminal 14' is connected with the battery pack negative detection terminal 24', the first negative detection circuit 27' and second negative detection circuit 28' are respectively connected with the first potential point 29a' and the second potential point 29b'. With this arrangement, the embodiment in FIG. 4 is equal to the embodiments in FIGS. 2 and 3. As described above, the voltages at the detecting points 25a', 26a' can be detected and calculated the difference. The comparison result of the difference and the predetermined value can be used to decide whether the power tool positive terminal 11' is well connected with the battery pack positive terminal 21'. In the same way, the comparison result of the voltage difference of the detecting points 27a', 28a' and the predetermined value can be used to decide whether the power tool negative terminal 13' is well connected with the battery pack negative terminal 24'.

The electrical combination 100' may further include a controller 201'. The battery pack controller 201' is capable of detecting the voltage of each detecting point, converting analog signal to digital signal conversion and carrying out the corresponding logic control. When one of the two connections described above is not good, the battery pack controller 201' can output a control signal to take appropriate protective measures. Specifically, the battery pack controller 201' can cut off the electric energy output of the battery pack through the battery pack positive terminal 21' and the battery pack negative terminal 24', that is disconnecting one of them with the battery pack 20'. A switch 202' is provided to cut off the connection between the battery pack positive terminal 21' and the battery 29'.

It is noted that the controller 201' also can be arranged in the power tool 10' or battery pack 20', and an extra terminal and a communication module are needed to exchange information.

The detecting points 25a', 26a', 27a' and 28a' can be arranged between the two resistors.

The above illustrates and describes basic principles, main features and advantages of the present invention. Those skilled in the art should appreciate that the above embodiments do not limit the invention hereinafter claimed in any form. Technical solutions obtained by equivalent substitution or equivalent variations all fall within the scope of the invention hereinafter claimed.

What is claimed is:

1. An electrical combination, comprising:
   a power tool comprising:
      a motor;
      a first power tool terminal connected to the motor;
      a second power tool terminal connected to the first power tool terminal; and
   a battery pack comprising:
      a first battery pack terminal for connecting with the first power tool terminal;
      a second battery pack terminal acting as a battery pack detection terminal for connecting with the second power tool terminal;
      a battery which is electrically connected with a first potential point and a second potential point which has different potential from the first potential point with the first battery pack terminal being connected to the first potential point;
      a first detection circuit for connecting the first battery pack terminal to the second potential point, the first detection circuit comprising a first resistor R1 and a second resistor R2 connected in series, wherein a voltage detecting point of the first detection circuit is disposed between the first resistor R1 and the second resistor R2; and
      a second detection circuit for connecting the battery pack detection terminal to the second potential point, the second detection circuit comprising a third resistor R3 and a fourth resistor R4 connected in series, wherein a voltage detecting point of the second detection circuit is disposed between the third resistor R3 and the fourth resistor R4; and
   a controller operably connected to the voltage detecting point of the first detection circuit to detect a first voltage detection signal from the first detection circuit, and operably connected to the voltage detecting point of the second detection circuit to detect a second voltage detection signal from the second detection circuit, and output a control signal to a switch to cut off a connection between the first potential point and the first battery pack terminal when the difference between the first voltage detection signal and the second voltage detection signal is greater than a predetermined value,
   wherein each of the first power tool terminal and the second power tool terminal of the power tool are metal connection plates and each of the first battery pack terminal and the second battery pack terminal are two metal claws and when the power tool and the battery pack are coupled, the two metal claws are disposed on the two sides of the corresponding connection plates.

2. The electrical combination of claim 1, wherein the first potential point is connected to the positive electrode of the battery.

3. The electrical combination of claim 1, wherein the second potential point is connected to the negative electrode of the battery.

* * * * *